US 6,437,254 B1

(12) United States Patent
Crudo et al.

(10) Patent No.: US 6,437,254 B1
(45) Date of Patent: Aug. 20, 2002

(54) APPARATUS AND METHOD FOR PRINTED CIRCUIT BOARD REPAIR

(75) Inventors: Alan Harris Crudo, Endicott, NY (US); John Gillette Davis, Charlotte, NC (US); Christian Robert Le Coz, Endicott, NY (US); Mark Vincent Pierson, Binghamton, NY (US); Amit Kumar Sarkhel, Endicott, NY (US); Ajit Kumar Trivedi, Endicott, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/938,402

(22) Filed: Aug. 24, 2001

Related U.S. Application Data

(62) Division of application No. 09/428,750, filed on Oct. 28, 1999, now Pat. No. 6,295,724, which is a division of application No. 09/023,552, filed on Feb. 13, 1998, now Pat. No. 6,018,866, which is a division of application No. 08/637,947, filed on Apr. 25, 1996, now Pat. No. 5,809,641.

(51) Int. Cl.[7] ................................................. H01R 9/09
(52) U.S. Cl. ........................ 174/267; 361/803; 439/46; 439/591; 324/758
(58) Field of Search ................................. 174/267, 266, 174/264, 263; 361/803; 439/591, 46, 75; 324/757, 758

(56) References Cited

U.S. PATENT DOCUMENTS

| 3,230,297 A | 1/1966 | Means |
| 3,361,869 A | 1/1968 | Gutiber et al. |
| 3,406,246 A | 10/1968 | Davidson et al. |
| 4,409,732 A | 10/1983 | Poff |
| 4,706,165 A | * 11/1987 | Takenaka et al. ........... 174/264 |
| 4,778,556 A | 10/1988 | Wery et al. |
| 5,161,726 A | 11/1992 | Francis |
| 5,257,452 A | 11/1993 | Imai et al. |
| 5,290,970 A | * 3/1994 | Currie ......................... 174/266 |
| 5,557,844 A | 9/1996 | Bhatt et al. |
| 5,913,687 A | * 6/1999 | Rathburn .................... 439/591 |
| 5,979,042 A | * 11/1999 | Duke ........................... 29/739 |

* cited by examiner

Primary Examiner—Albert W. Paladini
(74) Attorney, Agent, or Firm—Scully, Scott, Murphy & Presser; Lawrence R. Fraley

(57) ABSTRACT

A method and apparatus for efficiently repairing or reworking a printed circuit board having a solder ball grid array thereon efficiently and at minimum cost includes the steps of drilling out a plated-through hole to sever electrical connections between a ball grid array pad on one surface of the printed circuit board and internal circuits and circuits on an opposite surface of the printed circuit board; inserting a pin having an insulated sleeve surrounding a portion thereof into the drilled-out hole, the pin having attached to one end a wire for attachment to the ball grid array on one surface of the printed circuit board and a post at the other end of the pin for attachment of a wire to the post; the pin having a stop along its length to control vertical positioning of the pin in the drilled-out hole, the pin referred to as a via replacement (VR) pin. Alternately, after the plated through hole is drilled out, an insulated wire may be inserted into the hole with insulation removed from the length of the wire which extends beyond one surface of the printed circuit board. The bare length of wire is bent parallel to the surface of the printed circuit board and attached thereto by a solder reflow process. In a dog bone configuration, the wire is formed around a pad on the surface of the printed circuit board which receives the solder ball.

3 Claims, 3 Drawing Sheets

APPARATUS AND METHOD FOR PRINTED CIRCUIT BOARD REPAIR

This application is a divisional application of Ser. No. 09/428,750; filed Oct. 28, 1999, now U.S. Pat. No. 6,295,724 which is a divisional application of Ser. No. 09/023,552; filed Feb. 13, 1998, now U.S. Pat. No. 6,018,866; which is a divisional application of Ser. No. 08/637,947; filed Apr. 25, 1996, now U.S. Pat. No. 5,809,641.

BACKGROUND OF THE INVENTION

1. Field of the Invention.

The present invention relates to printed circuit boards used in electronic systems and, more particularly, to a method and apparatus for reworking or repairing printed circuit boards including solder ball grid arrays.

2. Prior Art.

An article in the *IBM Technical Disclosure Bulletin* (TDB), Vol. 24, No. 2, July 1981, at p. 1237, shows an insulating device for plugging a drilled-out hole in a printed circuit board (PCB). The article does not teach the method or apparatus in accordance with the present invention as taught and claimed herein.

An article in the *IBM TDB*, Vol. 33, No. 1B, June 1990, at p. 475, teaches a device for repairing a printed circuit net using a coaxial cable-to-board pin connection. The articles shows a method for reconstructing a deleted internal net of the PCB by utilizing an insulated bifurcate connector pin with an extended tail which provides pluggability with a coaxial cable. The article does not describe how the connector would be connected to pads in a ball grid array, and further, the physical size of the device shown in the article is much too large for use with a ball grid array pattern on a printed circuit board. In any event, the article does not teach nor suggest the present invention as taught and claimed herein.

An abstract No. 34488, published in *Research Disclosure*, December 1992, No. 344, by Kenneth Mason Publications, Ltd., shows a method for repairing open circuits in a printed circuit board. However, the article does not teach nor suggest the present invention as taught and claimed herein.

An article in the *IBM TDB*, Vol. 36, No. 12, December 1993, at p. 133, teaches a technique for reworking solder ball connections, engineering change or wire add to a printed circuit board. Although the article shows both via-in-pad and dog bone configurations, the article does not teach nor suggest either the wire loop technique nor the rigid pin structure as is taught and claimed herein.

U.S. Pat. No. 3,230,297 teaches a circuit board with a connector with solder resistant portions. However, the patent teaches a repair of a simple double-sided board rather than current multi-layer boards, and the patent does not address the problems associated with ball grid arrays as are taught and claimed herein.

U.S. Pat. No. 3,361,869 teaches an apparatus for making connections to a printed circuit board and for circuit line repair. However, the patent does not teach nor suggest the present invention as taught and claimed herein.

U.S. Pat. No. 3,406,246 teaches an apparatus for repair of printed circuit lines on a double-sided printed circuit board. However, the patent does not teach nor suggest the present invention as taught and claimed herein.

U.S. Pat. No. 4,409,732 teaches a circuit isolator element for use in isolating leads while testing components on a printed circuit board. However, the patent does not teach nor suggest the present invention as taught and claimed herein.

U.S. Pat. No. 4,778,556 teaches an apparatus for correcting or repairing printed circuit boards. The patent only teaches adding conductors to an existing printed circuit board. The patent does not teach nor suggest deletion of printed circuits nor ball grid array processing as are taught and claimed herein.

Although the prior art generally discusses repairing or reworking printed circuit boards, the prior art does not address the problem of isolating circuits and reconnection to a ball grid array i n state of the art printed circuit board structures which have extremely small spacing.

SUMMARY OF THE INVENTION

It is an object of the present invention to rework or repair a printed circuit board efficiently and at minimum cost.

Accordingly, method and apparatus for efficiently repairing or reworking a printed circuit board having a solder ball grid array thereon efficiently and at minimum cost includes the steps of drilling out a plated-through hole to sever electrical connections between a ball grid array pad on one surface of the printed circuit board and internal circuits and circuits on an opposite surface of the printed circuit board; inserting a pin having an insulated sleeve surrounding a portion thereof into the drilled-out hole, the pin having attached to one end a wire for attachment to the ball grid array on one surface of the printed circuit board and a post at the other end of the pin for attachment of a wire to the post; the pin having a stop along its length to control vertical positioning of the pin in the drilled-out hole, the pin referred to as a via replacement (VR) pin.

Alternately, after the plated through hole is drilled out, an insulated wire may be inserted into the hole with insulation removed from the length of the wire which extends beyond one surface of the printed circuit board. The bare length of wire is bent parallel to the surface of the printed circuit board and attached thereto by a solder reflow process. In a dog bone configuration, the wire is formed around a pad on the surface of the printed circuit board which receives the solder ball.

It is an advantage of the present invention that a printed circuit board may be reworked in such a fashion so as to be compatible with connection of either single wires or twisted pair or coaxial cable. Further, it is an advantage of the present invention that rework of a printed circuit board may be accomplished in a simple and inexpensive manner.

The foregoing has outlined rather broadly the features and technical advantages of the present invention in order that the detailed description of the invention that follows may be better understood. Additional features and advantages of the invention will be described hereinafter which form the subject of the claims of the invention.

DETAILED DESCRIPTION OF PREFERRED EMBODIMENTS OF THE INVENTION

Figure 1:
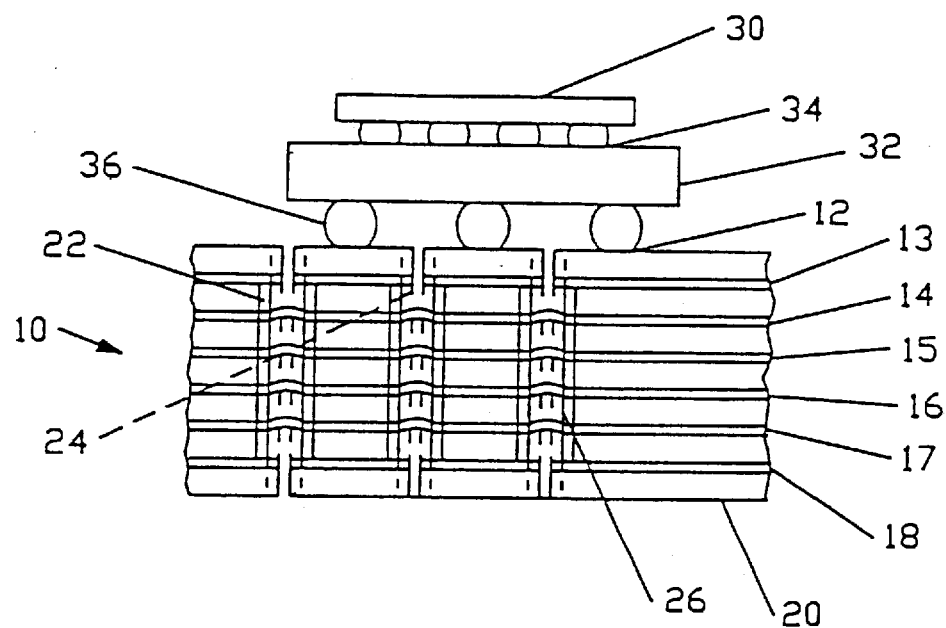
FIG. 1 is a cross-section view of a printed circuit board prior to a repair or rework.

Referring now to FIG. 1, a cross-section view of a printed circuit board (PCB) 10 will be described. Printed circuit board 10 includes a top printed circuit layer 12 and multiple internal printed circuit layers 13, 14, 15, 16, 17, and 18, as well as bottom printed circuit level 20. PCB 10 also includes a number of plated-through holes 22, 24, and 26 which permit connections between various levels of the multiple level PCB 10. Integrated circuit chip 30 is mounted to a substrate 32 by solder connections 34. The substrate 32 is mounted to the top printed circuit level 12 of PCB 10 by solder ball grid array (BGA) 36.

Although FIG. 1 shows the so-called 'dog bone design' of solder ball connections (SBC) where the solder balls are offset from the plated-through holes in printed circuit board 10, an alternate design would have the solder balls in BGA 36 axially aligned with the plated through holes 22, 24, 26 in printed circuit board 10. In such alternate design, the wire extending through the top of the PCB 10 must be shortened to avoid short circuiting to adjacent solder balls or pads.

For simplicity, the present invention will be described with respect to the embodiment employing the dog bone design where the solder ball connections are offset from the plated-through holes in the printed circuit board 10.

Figure 2:
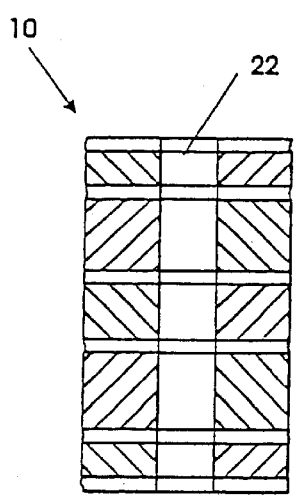
FIG. 2 is a cross-section view of a plated-through hole of a printed circuit board after a drill-out operation in accordance with the present invention.

Referring now to FIG. 2, the process according to the present invention will be further described. When repair or rework of a printed circuit board 10 is required, a plated-through hole such as hole 22 is drilled out to remove the conductive material which plates the walls of hole 22. This leaves a hole without connections between various levels of the multiple level circuit board 10.

Figure 3C:
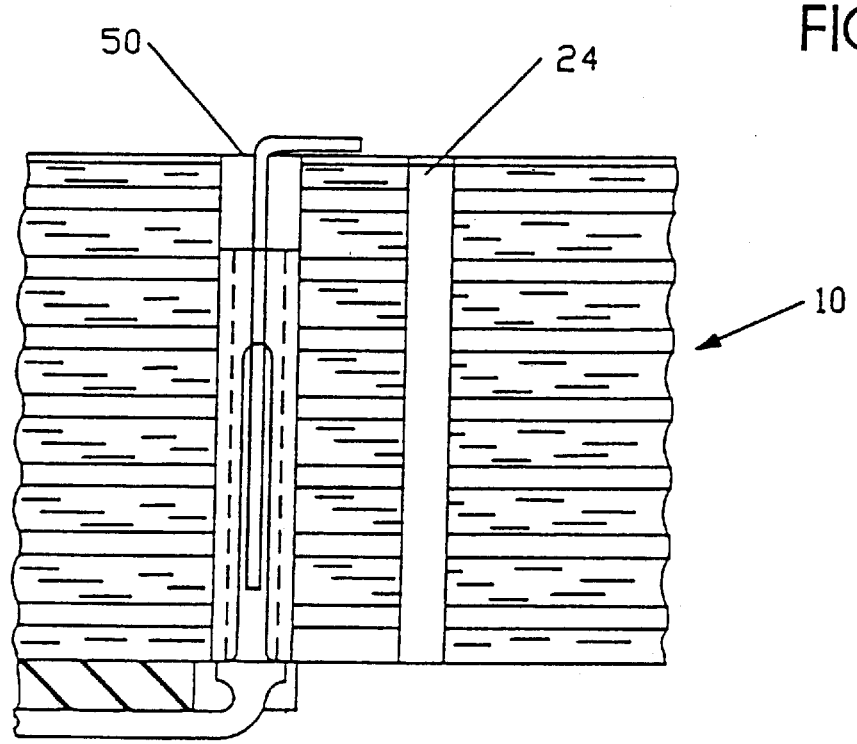
FIG. 3C is a cross-section view of a VR pin inserted in a drilled-out hold in a printed circuit board according to a first embodiment of the present invention.
Figure 3D:
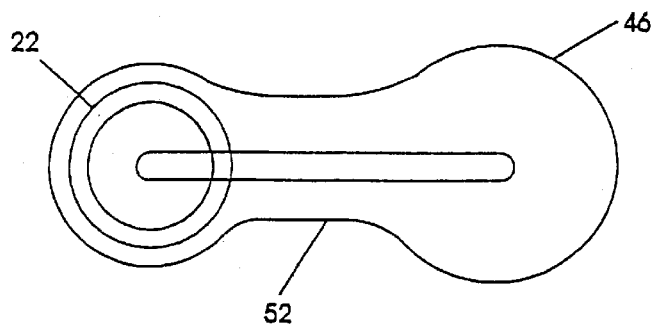
FIG. 3D is a top view of a portion of a printed circuit board showing a configuration of the connection wire as it is formed to make secure mechanical and electrical connection with a solder ball pad in accordance with a first embodiment of the present invention.
Figure 3A:
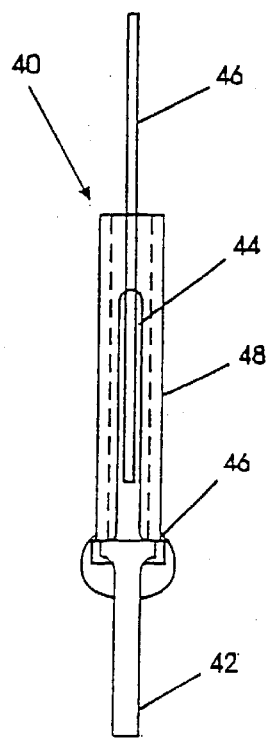
FIG. 3A is a front cross-section view of a VR pin in accordance with a first embodiment of the present invention.
Figure 3B:
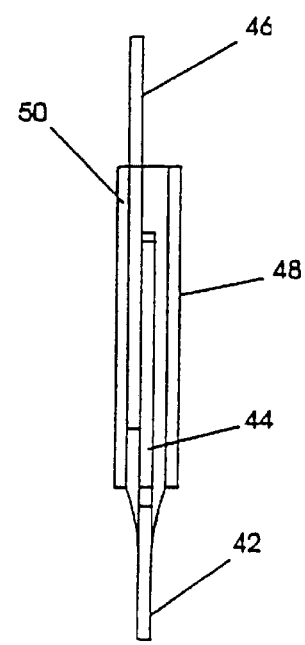
FIG. 3B is a side cross-section view of a VR pin in accordance with a first embodiment of the present invention.
Figure 4:
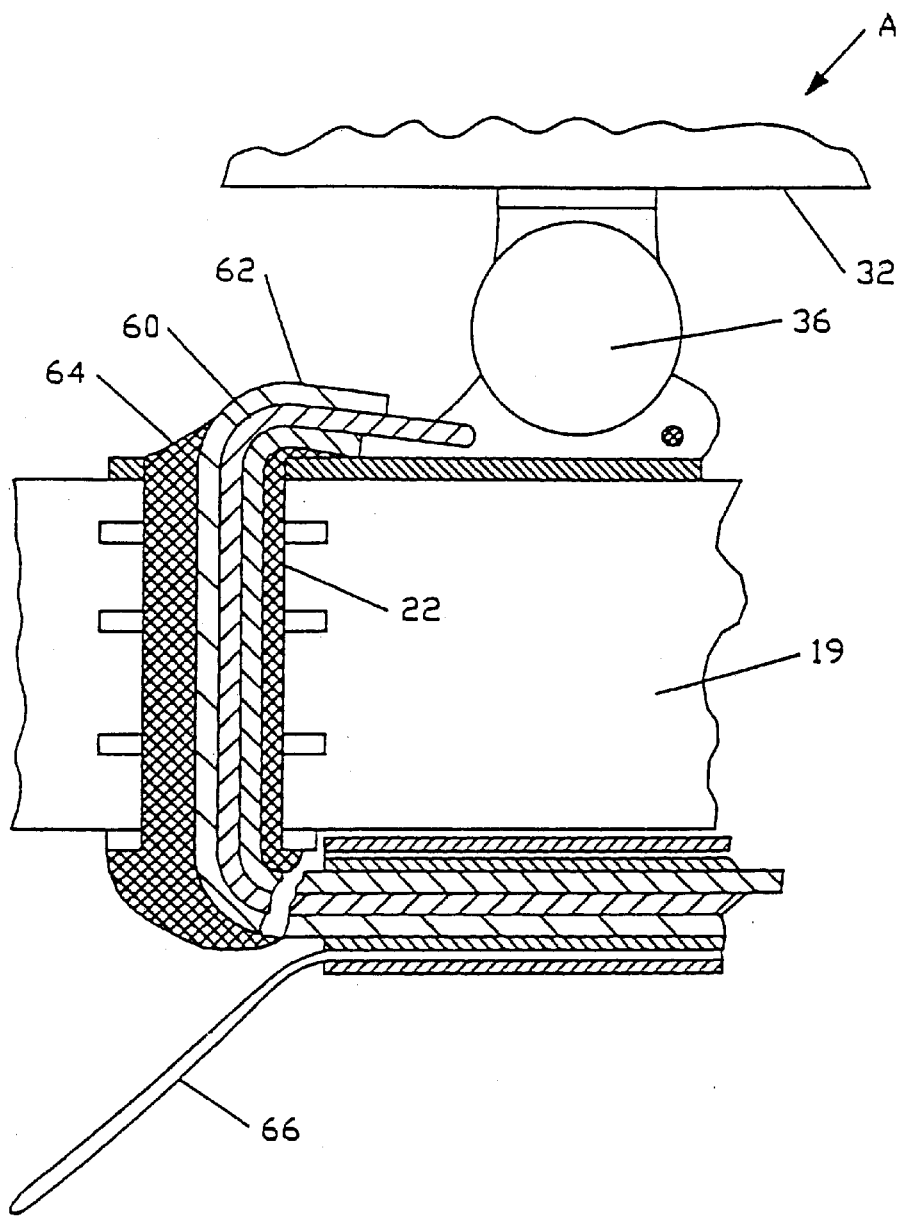
FIG. 4 is a cross-section view of a printed circuit board with an insulated wire inserted in the drilled-out plated-through hole in accordance with a second embodiment of the present invention.

To achieve the desired repair or rework, a wire 60 or pin 40 within an insulating sleeve 62, 48 (see FIGS. 3A, 3B, 3C, and 4) is inserted in the drilled-out hole 22 in PCB 10 such that desired connections can be made between ball grid array 36 on a top surface of PCB 10 and other wires, whether single wire or coaxial cable to be connected to the post of a VR pin 40 (see FIG. 3A), or to a tail of wire 60 (see FIG. 4).

Referring now to FIGS. 3A, 3B, and 3C, a first embodiment of the present invention will be described.

A via replacement (VR) pin 40 is shown in FIG. 3A in a front section view, in FIG. 3B in a side section view, and in FIG. 3C inserted in multi-level printed circuit board 10 in drilled-out hole (via) 22 and secured by a fluid tight, mechanically strong material, such as epoxy. VR pin 40 has a lower post portion 42 which extends below the bottom of PCB 10, a tail portion 44 which extends from the post portion 42 upward through the via 22, and a Z-stop 46 which controls the vertical positioning of the VR pin 40 within the via hole 22. A wire 46 is attached to tail portion 44 by a suitable electrically conductive attachment mechanism such as welding. Wire 46 may typically be a small diameter (approximately three mils) gold plated wire. Wire 46 is of sufficient length to extend out of hole 22 (FIG. 3C) and be bent over and affixed to ball grid array 36. An insulating sleeve 48 is placed over the wire 46 and tail 44 of VR pin 40. The insulating sleeve 48 prevents contact between any of the intermediate printed circuit planes 13, 14, 15, 16, 17, and 18 of PCB 10. Post 42 is the rigid extension of VR pin 40 which provides sufficient strength and is of appropriate material or plating such that a connection wire (not shown) can be attached by soldering or other means of attachment.

Referring now to FIG. 3B, the side section view of VR pin 40 will be described. Wire 46 is welded to tail 44 of VR pin 40 as described above. An epoxy araldite material 50 provides mechanical security between sleeve 48, tail 44, and wire 46 and provides a liquid tight seal around wire 46 and tail 44.

Wire 46, which extends out of the top of hole 22, may be bent and formed to be in electrical and mechanical contact with dog bone 52 on which a solder ball of solder ball grid array 36 is attached. (See FIG. 3D.)

Referring now to FIG. 4, an alternate embodiment of the present invention will be described. Although FIG. 4 shows a coaxial cable having a wire 60 surrounded by an insulator 62 with a ground lead 66, wire 60 could also be a single conductor surrounded by an insulator 62 and not a portion of a coaxial cable.

Figure 5:
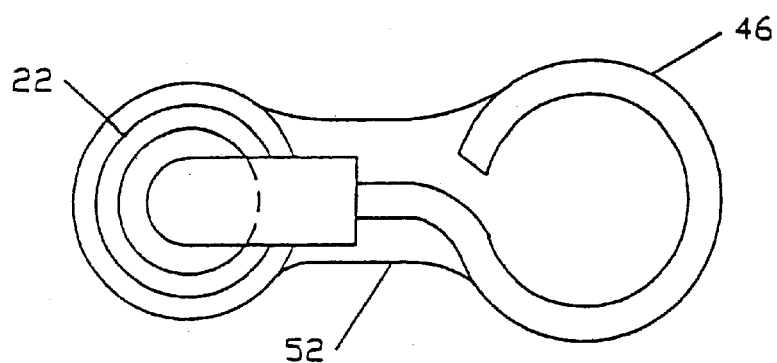
FIG. 5 is a top view of a printed circuit board showing the configuration of the connection wire as it is formed so as to have secure electrical and mechanical contact with a solder ball pad in accordance with a second embodiment of the present invention.

Wire 60 embedded in insulating material 62 is passed through via hole 22 in printed circuit board 10, and the wire is bent into an appropriate form to match the dog bone configuration (see FIG. 5) for receiving a solder ball of solder ball grid array 36. The wire and insulator is held in place and sealed with adhesive 64 which may be an epoxy material. The ground lead 66 of the coaxial cable may be soldered to an appropriate ground connection, and the bottom of hole 22 may be sealed with epoxy material as described above.

Although the present invention and its advantages have been described in detail, it should be understood that various changes, substitutions and alterations can be made herein without departing from the spirit and scope of the invention as defined by the appended claims.

What is claimed is:

1. A via replacement pin for use in reworking a printed circuit board, comprising:
    a post for extending beyond a first surface of the printed circuit board;
    a vertical positioner for positioning the pin in a via hole in the printed circuit board;
    a tail extending from the post partially toward a second surface of the printed circuit board; and
    a flexible wire, electrically connected and mechanically attached to the tail and extending beyond a second surface of the printed circuit board.

2. A via replacement pin, according to claim 1, further comprising an insulating sleeve, for insulating the tail and the flexible wire from the printed circuit board within the via hole.

3. Apparatus according to claim 1, wherein the post is bent along the first surface of the printed circuit board to increase mechanical strength of a connection between the post and the first surface of the printed circuit board.

\* \* \* \* \*